United States Patent [19]

Fukuhara et al.

[11] Patent Number: 5,641,701
[45] Date of Patent: Jun. 24, 1997

[54] METHOD FOR FABRICATING A SEMICONDUCTOR DEVICE WITH LASER PROGRAMABLE FUSES

[75] Inventors: Hideyuki Fukuhara, Ami-machi; Yoichi Miyai, Toride, both of Japan; David J. McElroy, Allen, Tex.

[73] Assignee: Texas Instruments Incorporated, Dallas, Tex.

[21] Appl. No.: 413,291

[22] Filed: Mar. 30, 1995

[51] Int. Cl.[6] .............................. H01L 21/70; H01L 27/00
[52] U.S. Cl. ........................ 438/6; 438/13; 438/601
[58] Field of Search ...................... 437/60, 922; 257/529

[56] References Cited

U.S. PATENT DOCUMENTS

5,241,212  8/1993  Motonami et al. ...................... 257/529
5,252,844  10/1993  Takagi .................................... 257/296
5,326,709  7/1994  Moon et al. ............................. 437/8
5,444,012  8/1995  Yoshizumi et al. ..................... 437/60

Primary Examiner—Jey Tsai
Attorney, Agent, or Firm—Mark E. Courtney; W. James Brady, III; Richard L. Donaldson

[57] ABSTRACT

A method for fabricating a semiconductor device includes the steps of: forming fuses (40) and conductive pads (46) above a semiconductor substrate (43); depositing a layer of cap oxide (44) over the fuses and the conductive pads; sintering the cap oxide; etching back the layer of cap oxide until the top surface of an insulator (42) over the fuses and the top surfaces of the conductive pads are exposed; performing electrical tests (48) by way of the conductive pads; trimming (50) at least a part of the fuses with a laser beam; depositing a silicon nitride layer (52) overall; depositing a mask coating over the silicon nitride; patterning the mask coating (54) to expose the conductive pads; and etching the mask coating and the silicon nitride layer to expose the conductive pads.

7 Claims, 14 Drawing Sheets

METHOD FOR FABRICATING A SEMICONDUCTOR DEVICE WITH LASER PROGRAMABLE FUSES

FIELD OF THE INVENTION

This invention relates to a process for fabricating an integrated circuit device and more particularly to a method for making a laser repair in the device.

BACKGROUND OF THE INVENTION

During the process of fabricating integrated circuit devices, there are redundant circuits and other optional circuit arrangements which can be selected to assure desired operating functions. Such selections can be made by trimming certain fuses included in the device. Generally, a laser beam is used for trimming the fuses. An electrical test procedure is accomplished in conjunction with the laser trimming process.

Figure 1A:
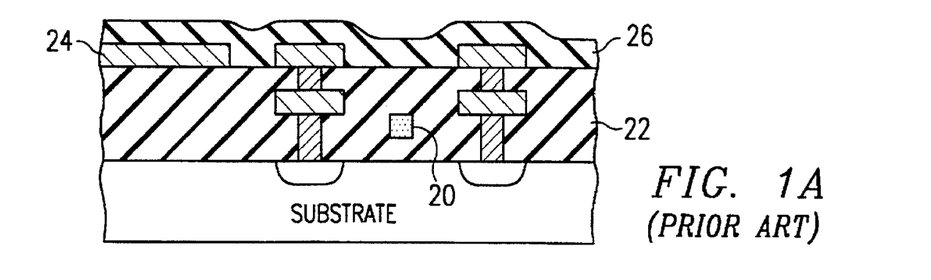
FIGS. 1(a)–1(h) present a prior art laser repair process sequence.
Figure 1B:
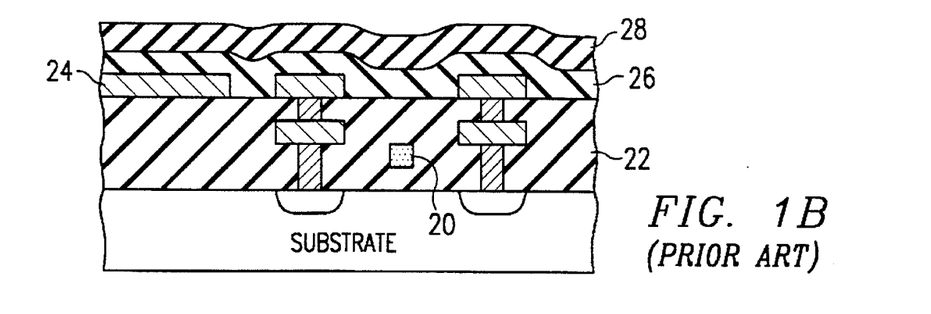
Figure 1C:
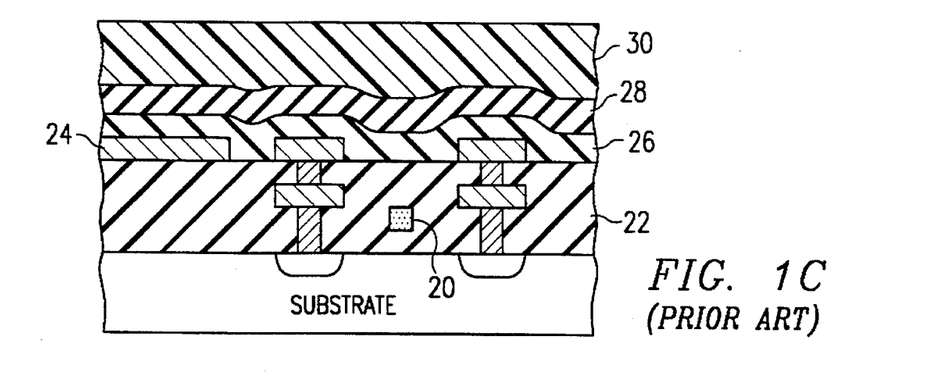
Figure 1D:
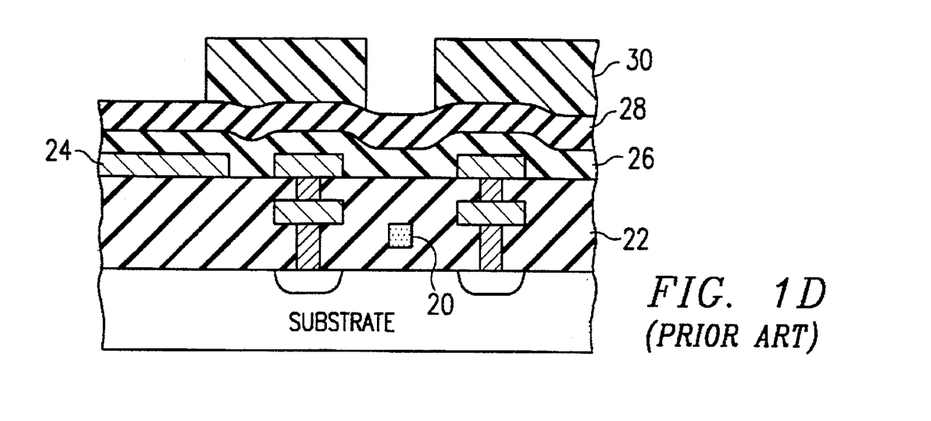
Figure 1E:
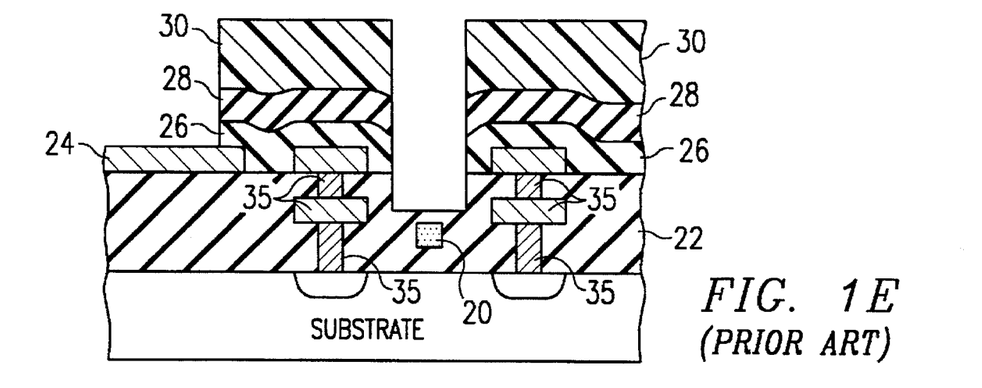
Figure 1F:
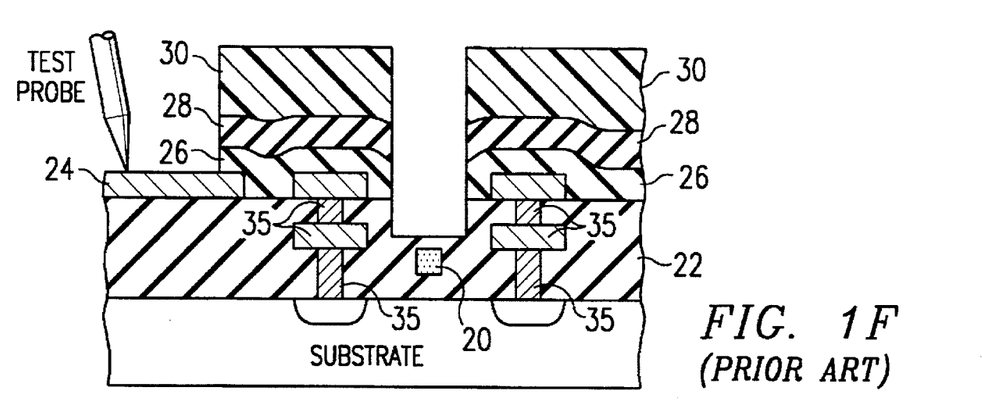
Figure 1G:
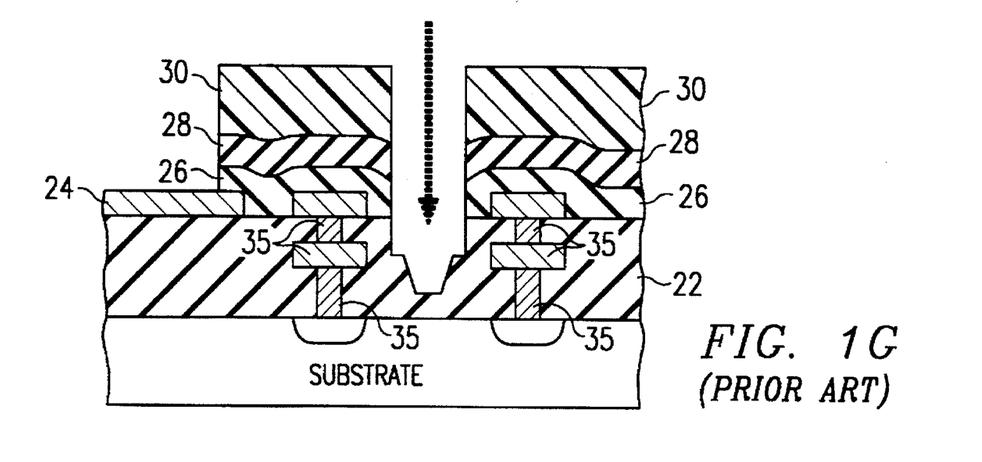
Figure 1H:
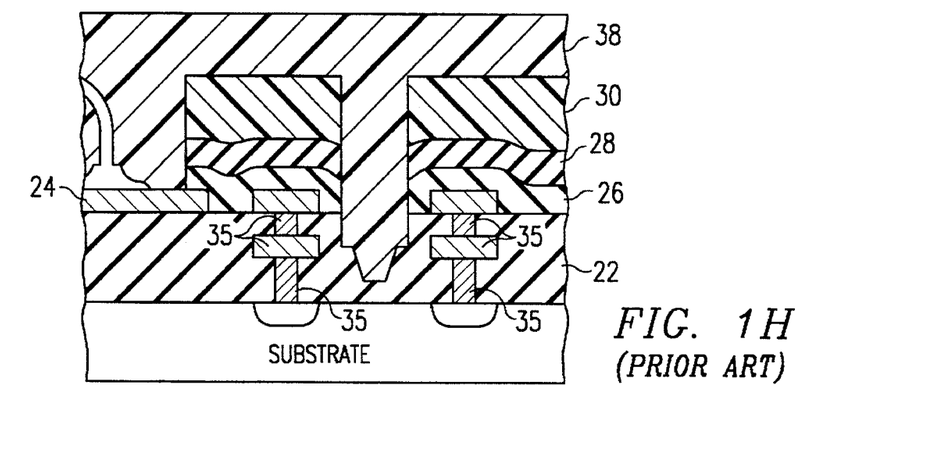

As shown in the sequence of FIGS. 1(a) through 1(h), there is shown a somewhat uneconomical prior art method for making laser repairs. In FIG. 1(a) fuses 20 are fabricated in a polysilicon conductive layer that is surrounded by silicon dioxide 22. Bonding pads 24 are fabricated in a metal layer, which is covered by a layer of silicon dioxide 26 and a layer of silicon nitride 28, as in FIG. 1(b). A pix coating 30, e.g., a polymide resin, is laid over the silicon nitride patterned, and cured to provide access to the pads and fuses, as in FIGS. 1(c) and (d). The pix coating, the silicon nitride, and the silicon dioxide are etched away from the pads for direct access for electrical testing, as shown in FIG. 1(e) and 1(f). The pix coating, the silicon nitride, and a part of the silicon dioxide are etched away from above the fuses for laser trimming, as shown in FIG. 1(g). An advantage of this process is that only a single photoresist mask step is used in the sequence of processing steps. Thereafter the electrical tests and the laser trimming are performed, but there are device moisture barriers 35 to prevent contamination caused by ambient atmospheric conditions. These moisture barriers 35 occupy a substantial area in addition to the circuit area and therefore raise the cost of making the device. The remaining partially exposed fuses may suffer corrosion or other deleterious effects from the exposure causing the device to subsequently malfunction. Molding compound 38 which is applied thereafter does not protect the device from harmful effects of the ambient atmosphere.

Figure 2A:
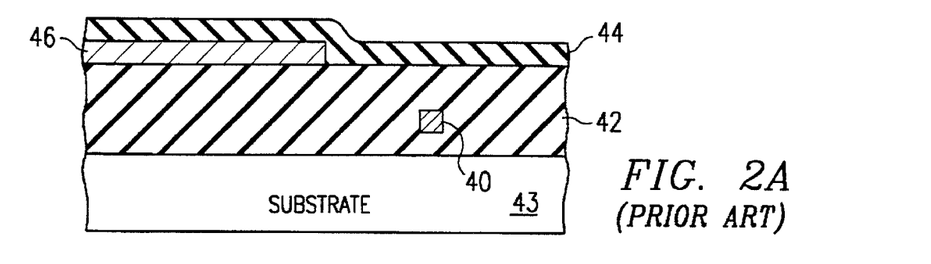
FIGS. 2(a)–2(i) present another prior art laser repair process sequence.
Figure 2B:
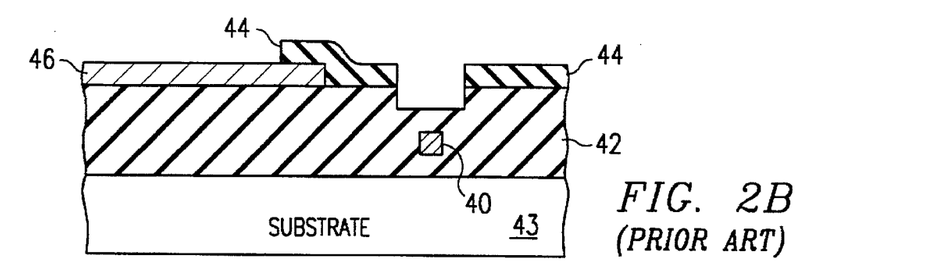
Figure 2C:
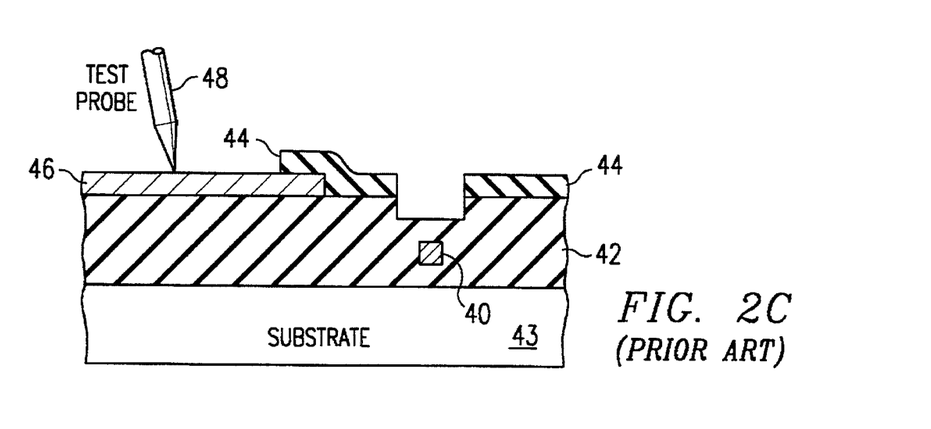
Figure 2D:
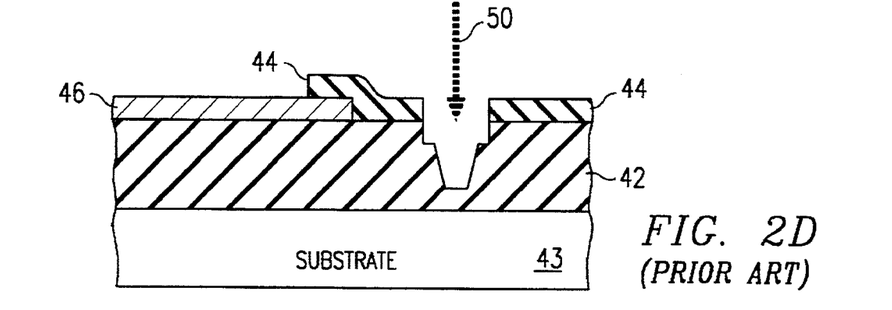
Figure 2E:
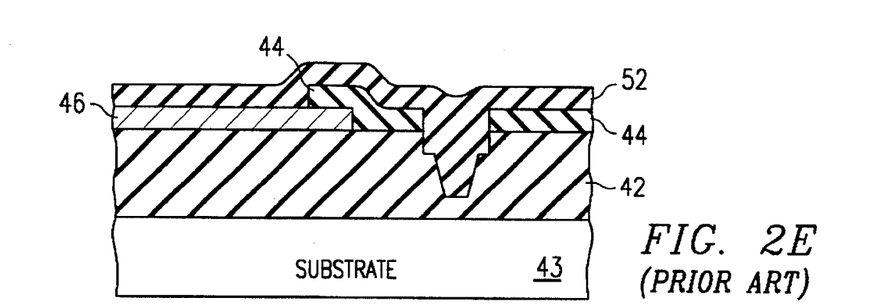
Figure 2F:
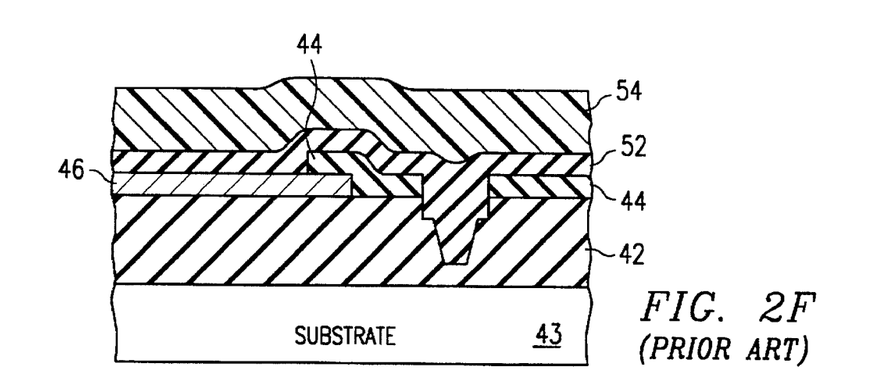
Figure 2G:
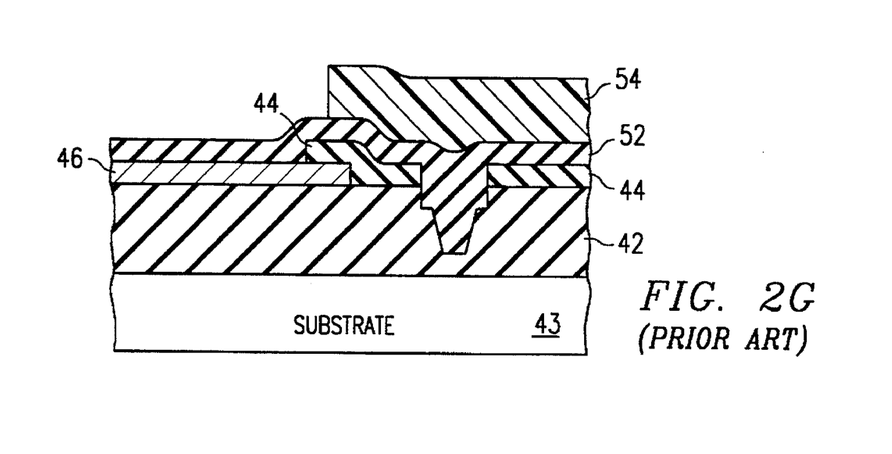
Figure 2H:
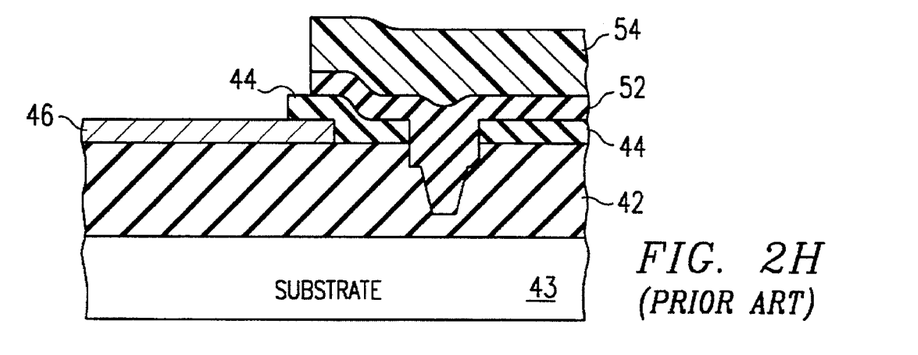
Figure 2I:
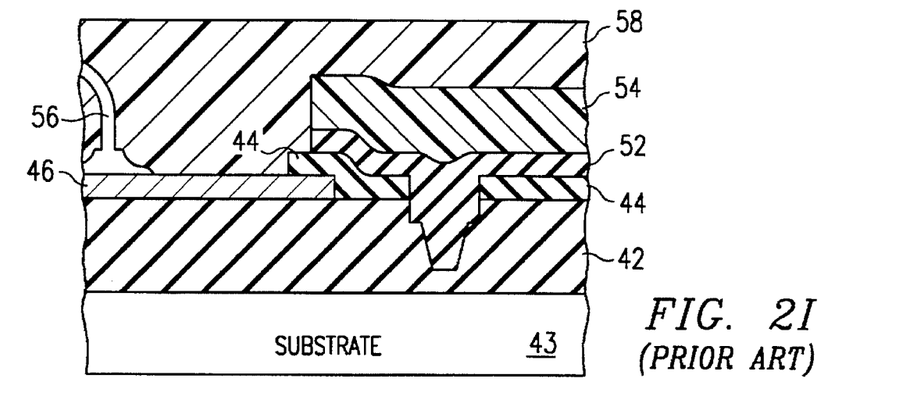

In another prior art method, test fuses 40 are fabricated in a polysilicon conductive layer surrounded by silicon dioxide 42 similar to the first method, as shown in FIG. 2(a). Thereafter a cap oxide 44, e.g., silicon dioxide, is deposited over the metallic layer 46 and silicon dioxide 42. The cap oxide is sintered and the surface of the device is patterned to nearly expose the fuses 40 of the device, as shown in FIG. 2(b). The cap oxide also is etched away from over the pads 46. The silicon dioxide is etched down nearly to the level of the fuses. In FIG. 2(c) electrical tests are performed through probes 48 contacting with the exposed pads, and a laser beam 50 is used for trimming fuses, as shown in FIG. 2(d). Once the testing and laser trimming are completed, a silicon nitride layer 52 is deposited over the top of the device and into the fuse cavity, as shown in FIG. 2(e). A pix coating 54 is laid over the silicon nitride 52 and patterned to provide access to the pads, as shown in FIG. 2(f). The pix material and the silicon nitride are etched to expose the pads for use in a system, as shown in FIGS. 2(g) and 2(h). Bonding wires 56 are connected to the bonding pads 46, and a molding compound 58 is added to encapsulate the device. A disadvantage to this method is that a second costly masking sequence is added into the sequence of processing steps. An advantage in this process is that the silicon nitride protects the non-trimmed fuses from deleterious effects which can occur if those fuses are left unprotected from the ambient atmosphere.

SUMMARY OF THE INVENTION

These and other problems are solved by a method for fabricating a semiconductor device including the steps of: forming fuses in a first metallic layer; covering the first metallic layer with an insulator layer; forming conductive pads in a second metallic layer; depositing a layer of cap oxide over the pads and the insulator layer; etching back the layer of cap oxide until the top surfaces of the conductive pads and of the insulator layer over the fuses are exposed and sidewall oxides remain on the conducting pads; performing electrical tests; trimming at least a part of the fuses with a laser beam; depositing a silicon nitride layer; depositing a mask coating over the silicon nitride layer; patterning the mask coating for exposing the conductive pads; and etching the pix coating and the silicon nitride layer to expose the conductive pads.

An advantage of this method is that it is relatively low cost because only one masking sequence is used in the sequence of steps. Risk of deleterious effects is low because the fuses are covered by the silicon nitride after the laser trimming operation.

Several variations of the single masking sequence are disclosed.

BRIEF DESCRIPTION OF THE DRAWINGS

A better understanding of the invention may be derived by reference to the drawings which represent exemplary process sequences and wherein.

DETAILED DESCRIPTION

Referring now to FIGS. 3(a) through 3(i), there is shown a new sequence of steps in the process of fabricating an integrated circuit semiconductor device. This sequence of steps relates to the testing of circuits within the device, and to the switching good redundant circuits in replacement of defective regular circuits.

Figure 3A:
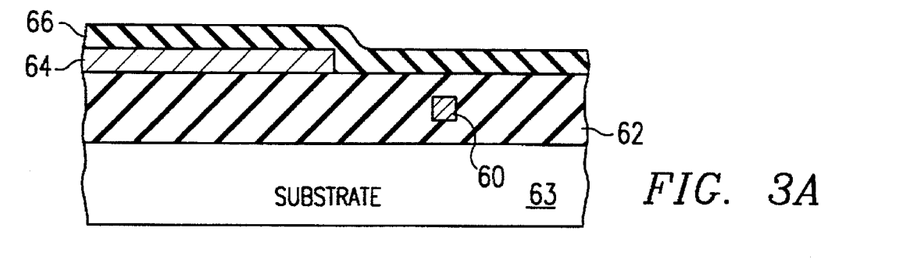
FIGS. 3(a)–3(i) present an exemplary laser repair process sequence in accordance with the invention.

Referring now to FIG. 3(a), there is shown a fuse 60 fabricated in a metallic layer surrounded by a dielectric 62, such as silicon dioxide 62. The dielectric 62 is laid over a silicon substrate 63. On the top surface of the dielectric 62, there is a conductive metallic pad 64 formed for making interconnections between circuits built within the device (but not shown) and other external circuits. A layer of dielectric cap oxide 66, which may be silicon dioxide, is laid over the pad 64. Although a single fuse 60 and a single pad 64 are shown, they are considered to be representative of a plurality of similar circuit elements which are not shown for purposes of clarifying the drawing.

A sinter operation may be performed at this stage of device fabrication.

Figure 3B:
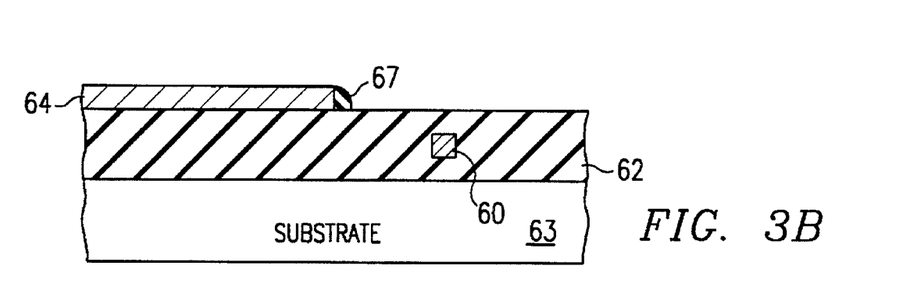

In FIG. 3(b), the device is shown following an overall cap oxide etch back which removes the cap oxide 66 down to the top surface of the conductive pad 64 and to the top surface insulator 62. A sidewall insulator 67 is left on the conductive pad 64. For etching, the silicon dioxide cap oxide mixture of $CHF_3$, $CF_4$ and Ar may be used in a ratio of approximately 20/20/1000. Alternatively, a wet etch might be used to clear the top metal, although this will not leave sidewall oxide to prevent side hillocks during nitride deposition.

Figure 3C:
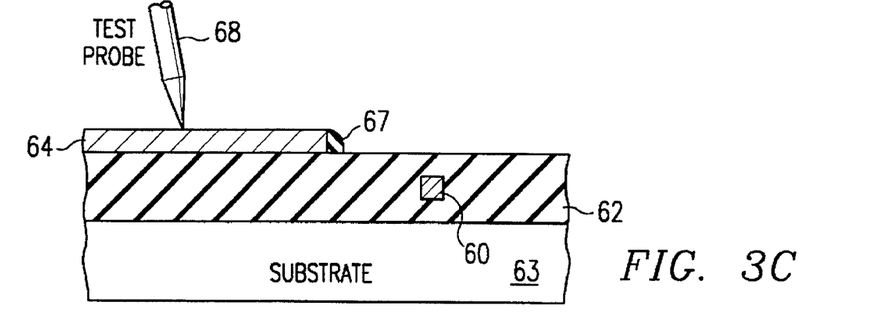

5 FIG. 3(c) shows an electrical probe from a testing apparatus making contact with the conductive pad 64 for making quality control tests. Some circuit defects may be uncovered as a result of the tests. Some of those defects can be removed from active operation of the device and can be replaced by other good redundant circuits by opening one or more fuses in the device.

Figure 3D:
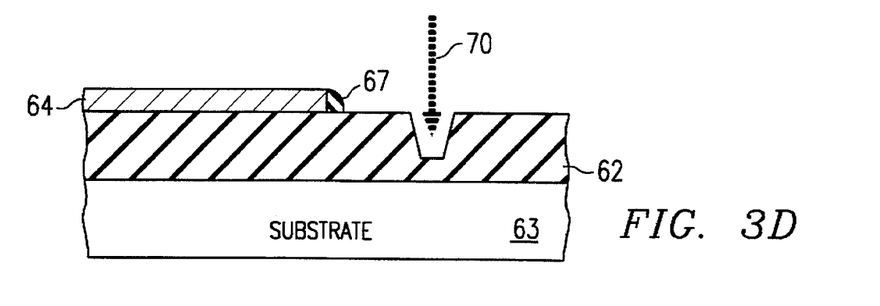
Figure 3E:
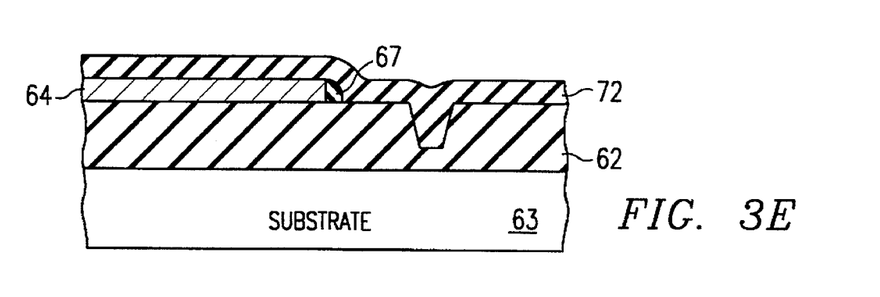

FIG. 3(d) shows a laser beam 70 which is used for blowing a fuse leaving a blow fuse cavity where the fuse 60 had been located. After all of the fuses are blown, as desired, an insulative layer 72, such as silicon nitride $Si_3N_4$ is over the entire device and filling in the blown fuse cavities, as shown in FIG. 3(e).

Figure 3F:
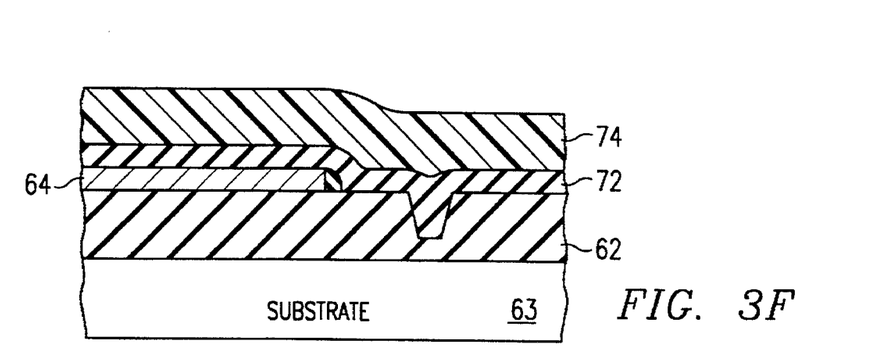
Figure 3G:
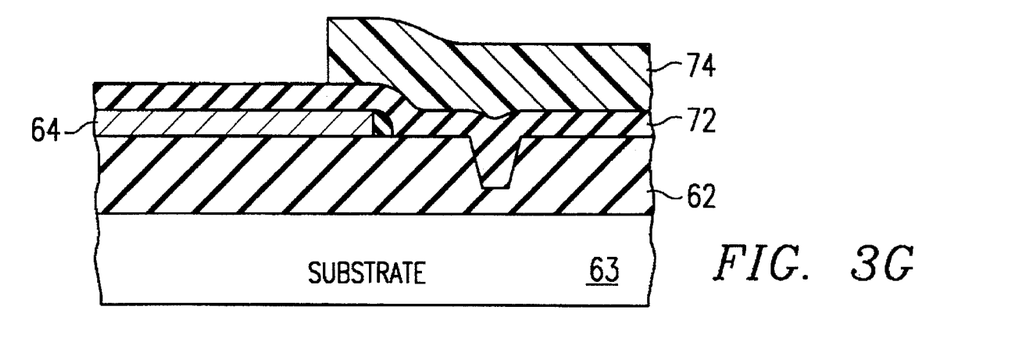

In FIG. 3(f), there is shown a masking material 74 laid over the top of the device. This may be a photoresist that can be patterned for exposing the conductive pads 64, as shown in FIG. 3(g).

Figure 3H:
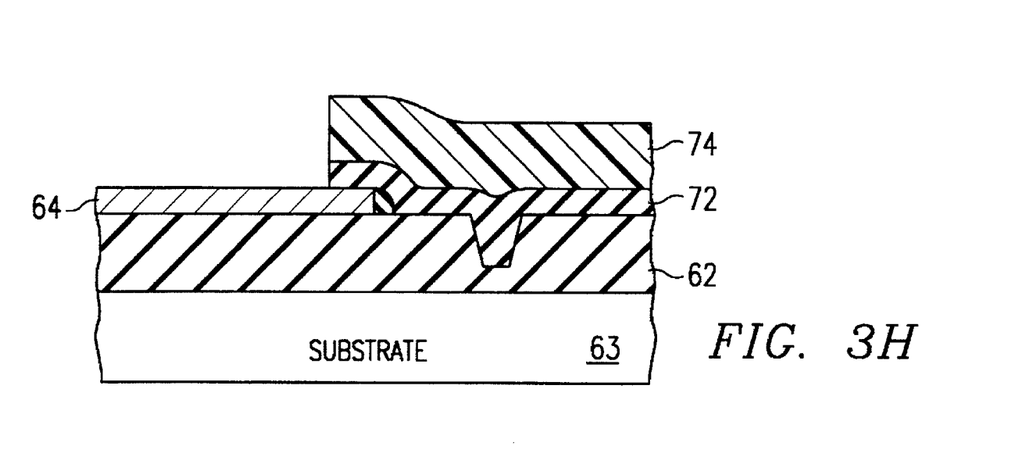

Referring now to FIG. 3(h), the patterned mask is used for etching back the insulative layer of silicon nitride to fully expose the conductive pads 64. A gas mixture of $CF_4$, oxygen, and nitrogen in a ratio of 120/30/20 may be used for the etching of the silicon nitride.

Figure 3I:
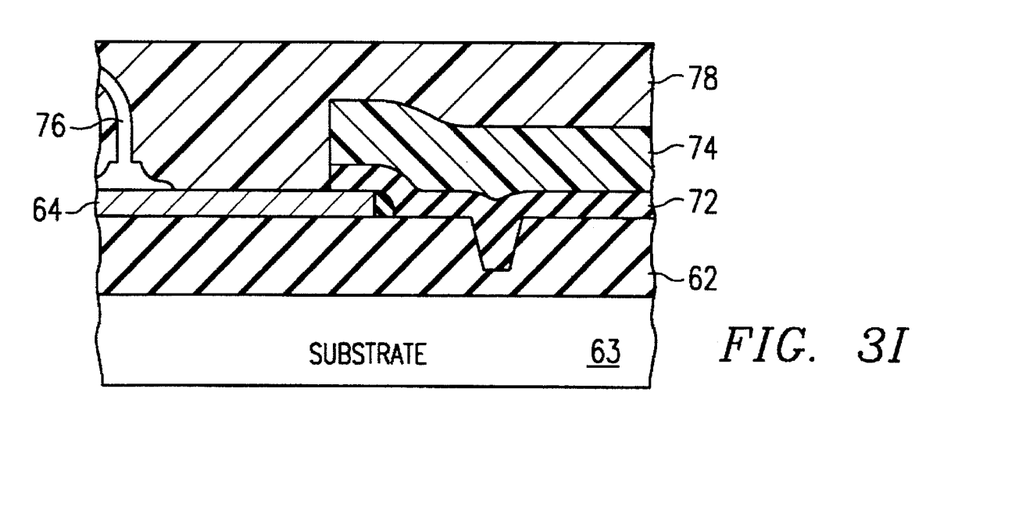

Finally as shown in FIG. 3(i), bonding wires, such as the wire 76, are bonded to the conductive pad 64 for interconnecting with external circuits, which are not shown. A molding compound 78 is applied thereafter to protect the device from harmful effect of the atmosphere and other hazards.

Advantageously, after the sinter operation of the device in the form shown in FIG. 3(a), the etching is accomplished without the need for a mask. The etching is applied universally over the entire device. This saves an otherwise expensive sequence of steps for forming and removing masking material. The bonding pads are exposed for testing while the top level of metallic wiring retains sidewall oxide when dry etching is used to prevent electrical shorting and hillock growth. After the desired fused are trimmed, or blown, the silicon nitride film is applied to improve reliability by preventing deleterious effects caused by ambient atmospheric conditions. Additional area consuming moisture barrier structures are not used. Thus a lower cost sequence of process steps are presented for making electrical tests, for trimming desired fuses, and for providing good hermetic sealing.

Referring now to FIGS. 4(a) through 4(h), there is presented another low cost sequence of steps for testing internal circuits of a semiconductor device and replacing defective ones of them with good redundant circuits.

Figure 4A:
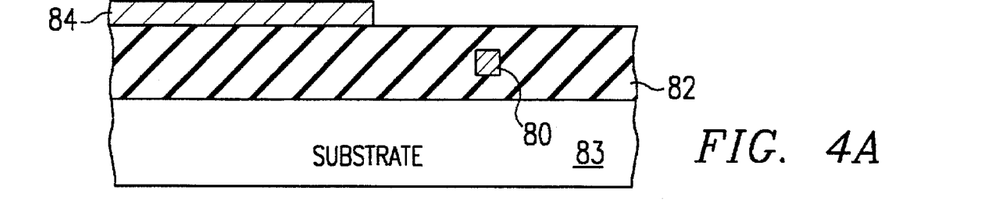
FIGS. 4(a)–4(h) present another exemplary laser repair process sequence in accordance with the invention.
Figure 4B:
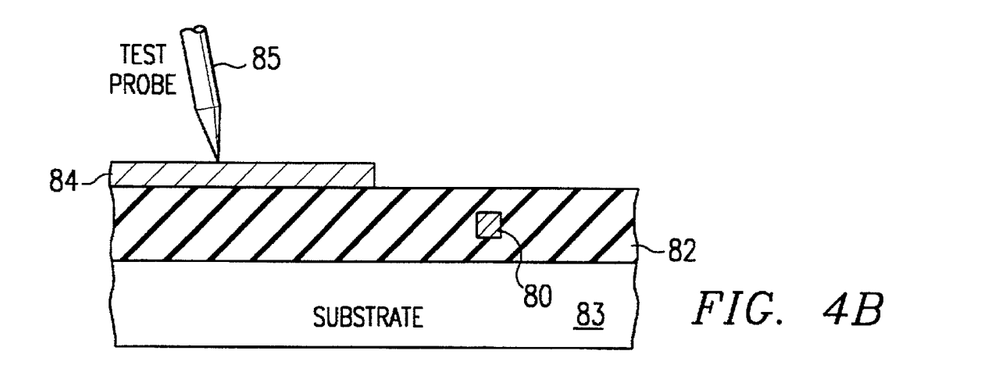

Referring now to FIG. 4(a), the device is shown including a fuse 80 surrounded by a dielectric 82 over a semiconductor substrate 83. A conductive pad 84 is laid on top of the dielectric 84. The fuse 80 and conductive pad 84 represent many of each. At this stage of fabrication sintering is carried out. After the sintering operation, a test probe is connected to the conductive pad 84 for performing electrical tests, as shown in FIG. 4(b).

Figure 4C:
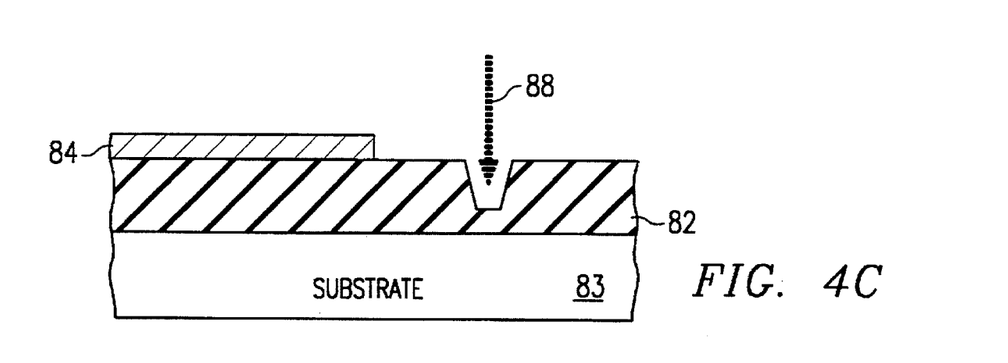
Figure 4D:
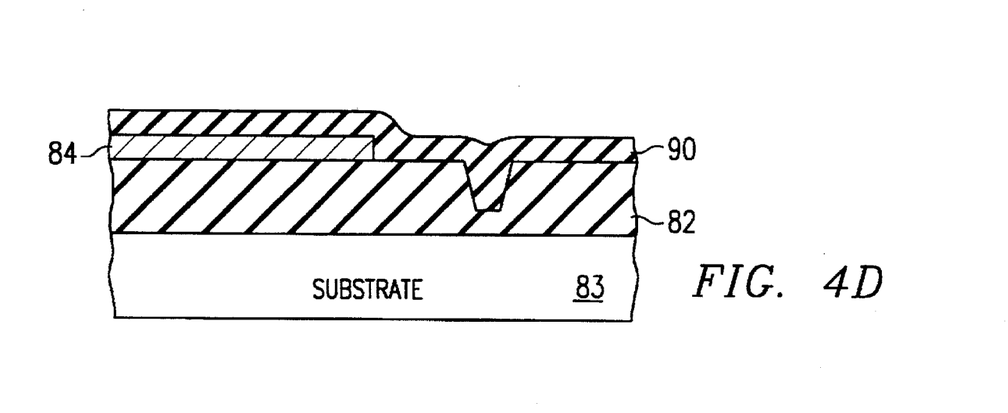
Figure 4E:
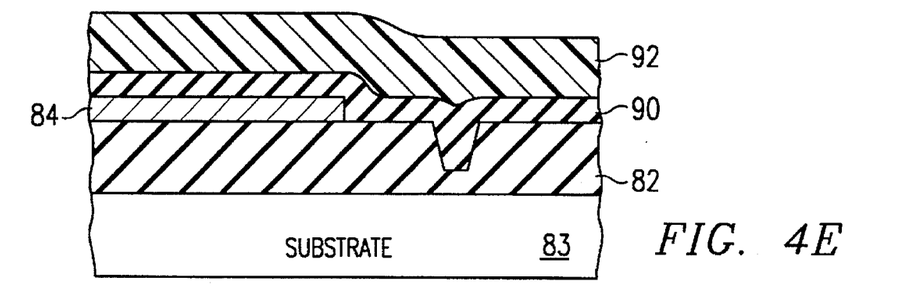

In FIG. 4(c), defective circuits (not shown) are replaced by good redundant circuits by laser beam 88 trimming of the fuses. A fuse cavity is opened where fuses are blown. A dielectric layer 90 of silicon nitride $Si_3N_4$ is laid universally over the top of the device to cover the conductive pads 84 and to fill the fuse cavities. Then a masking material 92, such as a photoresist, is laid over the entire device, as shown in FIG. 4(e).

Figure 4F:
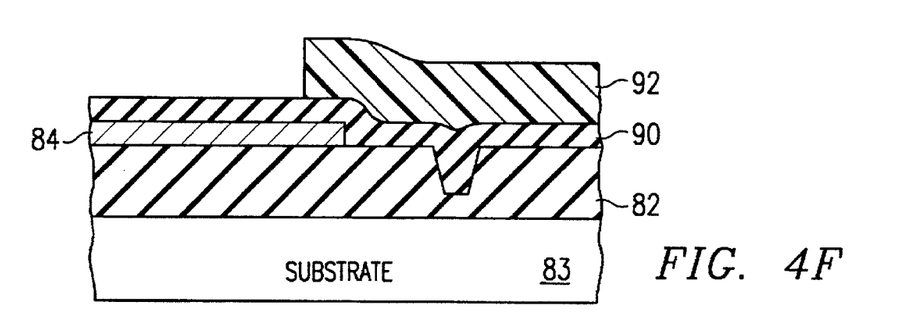
Figure 4G:
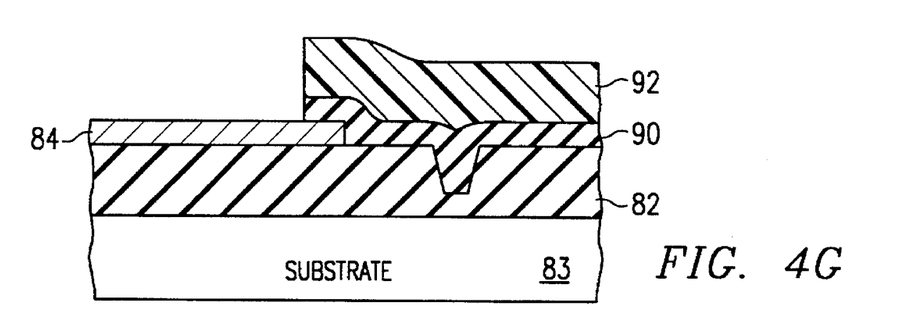
Figure 4H:
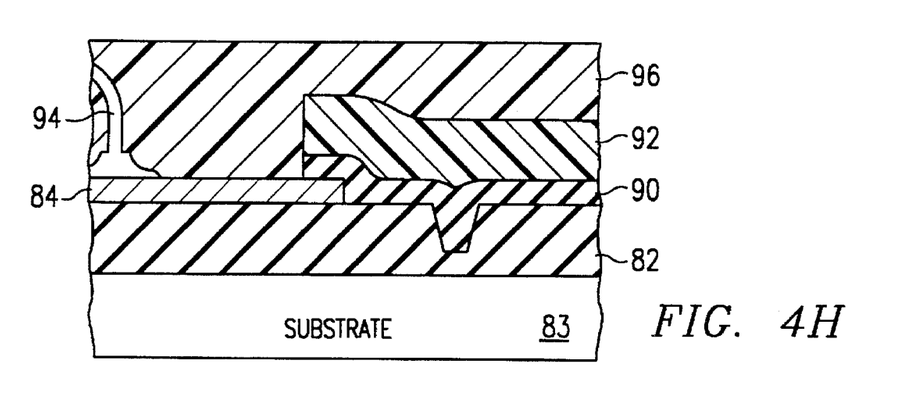

As shown in FIG. 4(f), the masking material 92 is patterned for exposing the conductive pad and is cured. Then the silicon nitride layer is etched back from the top of the conductive pads 84 to expose those pads. The previously mentioned mixture of $CF_4$, oxygen, and nitrogen can be used as the etchant. Bonding wires, such as the wire 94, are connected to the conductive pads 84 and a molding compound 96 is applied.

This sequence of processing steps has the further advantage of eliminating the steps of applying the cap oxide and etching back, as included in the sequence of FIG. 3.

Referring now to FIGS. 5(a) through 5(h), there is shown another variation of the new sequence of steps for testing for defective circuits and for replacing defective ones with good ones.

Figure 5A:
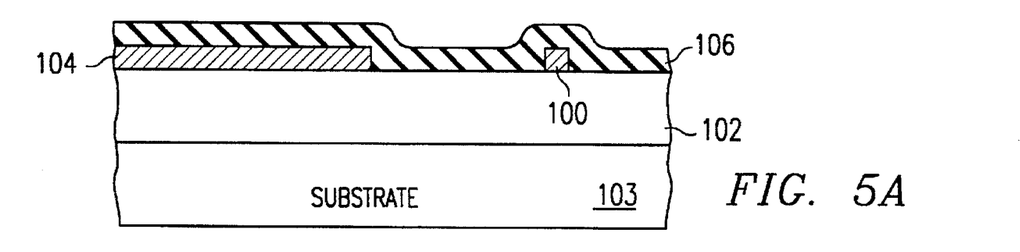
FIGS. 5(a)–5(h) present a further exemplary laser repair process sequence in accordance with the invention.

In FIG. 5(a), the device is shown including a metallic fuse 100 fabricated in the same metal level as the conductive pad 104 on the top surface of an cap oxide insulator layer 102, which may be silicon dioxide. They are fabricated on top of a substrate 103. An insulative layer of silicon dioxide 106 covers the fuses 100, the conductive pads 104, and the silicon dioxide 102.

Figure 5B:
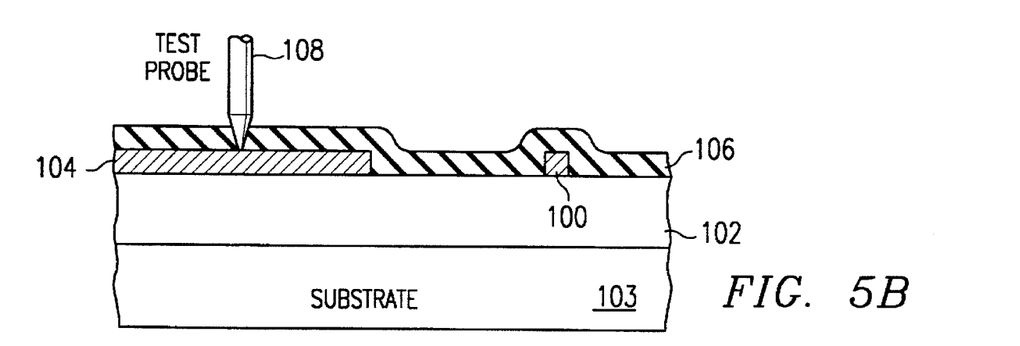
Figure 5C:
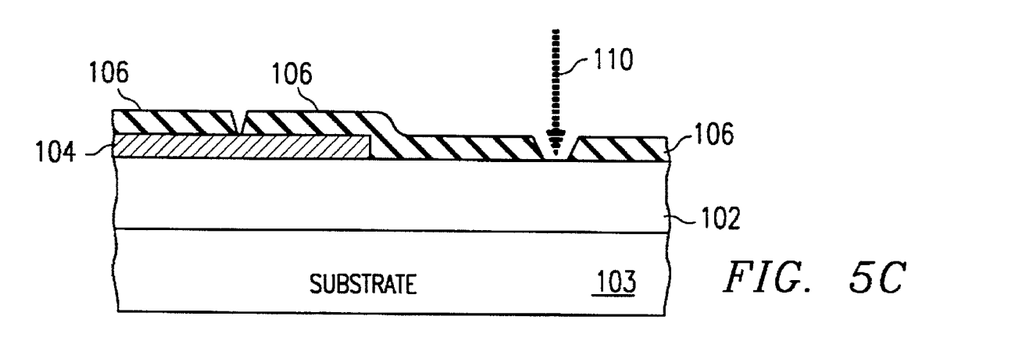

As shown in FIG. 5(b), a test probe 108 is mechanically pushed through the cap oxide 106 to contact the conductive pad 104 for testing internal circuits, not shown. Defective circuits are replaced by good redundant circuits by laser beam 110 trimming, as shown in FIG. 5(c). Cavities are left in the cap oxide 106 where the test probe was inserted and where any fuse was blown.

Figure 5D:
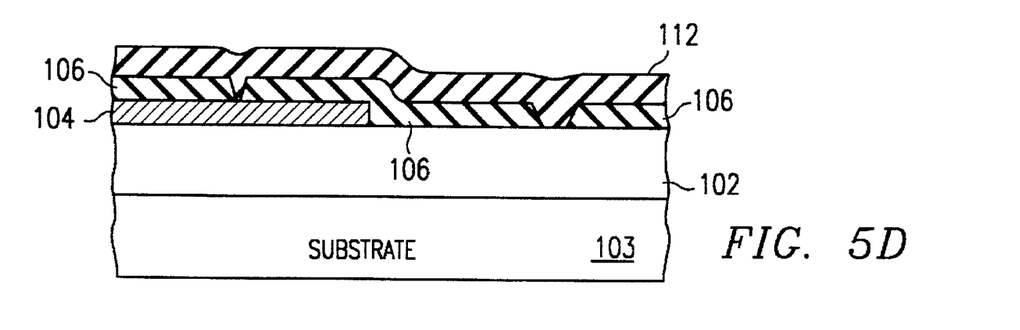
Figure 5E:
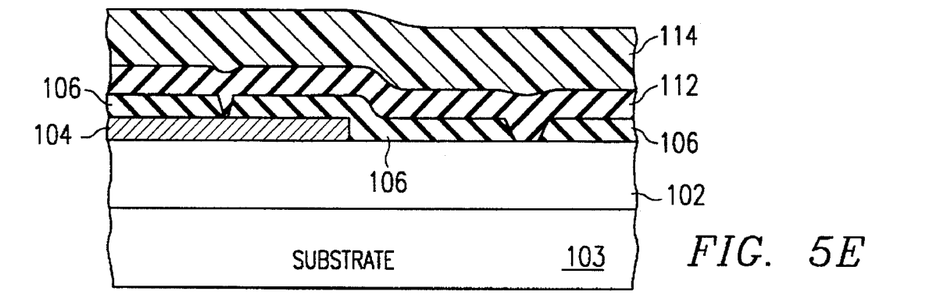
Figure 5F:
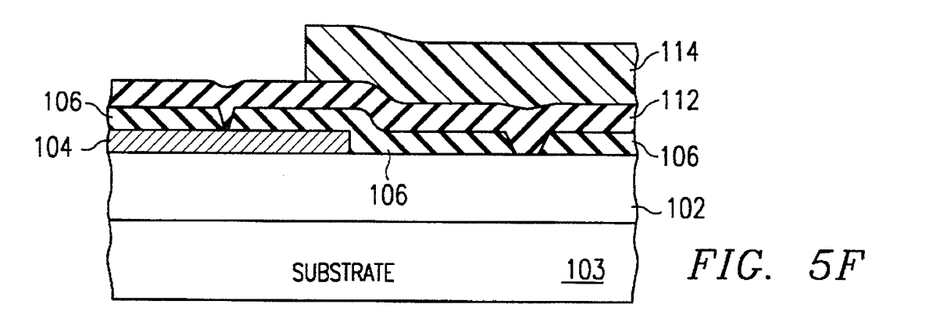
Figure 5G:
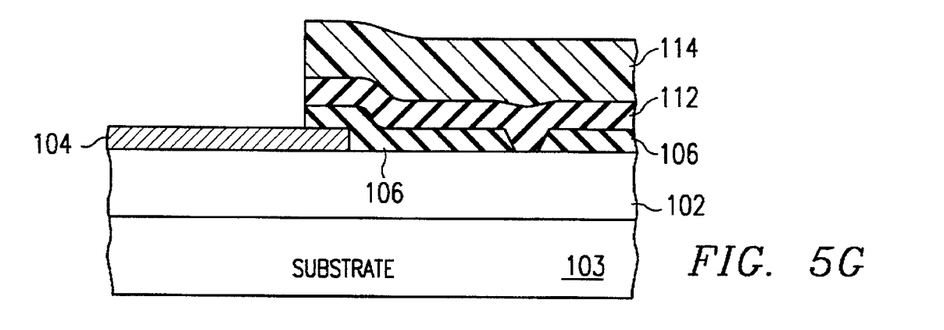
Figure 5H:
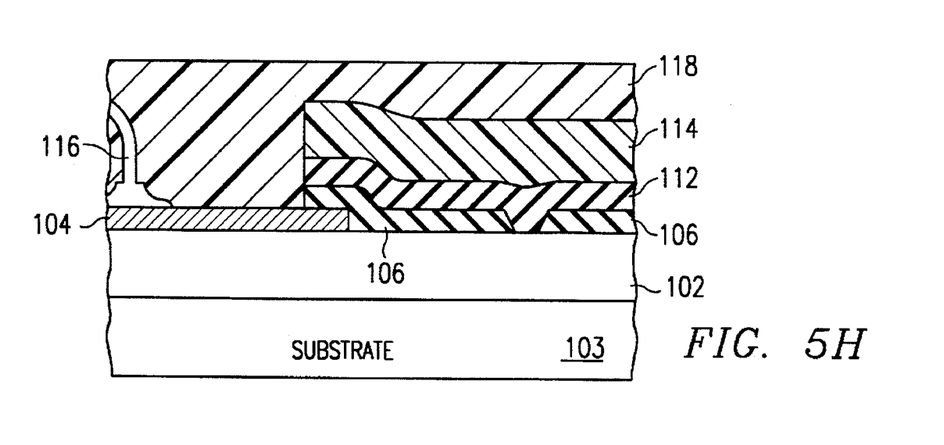

In FIG. 5(d), a layer of silicon nitride 112 is laid over the entire device to cover the conductive pads 104 and the cap oxide 106 and to fill cavities in the cap oxide. Thereafter a masking material 114 is deposited overall, as shown in FIG. 5(e), is patterned, and is cured for exposing the conductive pads 104, as shown in FIG. 5(f).

In FIG. 5 (g), the silicon nitride layer 112 and the cap oxide are etched back to expose the surface of the conductive pads 104. Appropriate etchants are used. Finally bonding wires 116 are connected to the conductive pads 104 and a molding compound 118 is applied to protect the device.

Advantageously, the cost of the testing and redundancy replacement steps is reduced because the conductive pads are exposed for testing without a sequence of masking steps, and additional moisture barrier structures are avoided.

Referring now to FIGS. 6(a) through 6(h), there is shown a further variation for testing and for replacing defective circuits. The sequence of steps is similar to the sequence of steps shown in FIGS. 5(a) through 5(h) so identical reference numerals are used to represent the same elements.

Figure 6A:
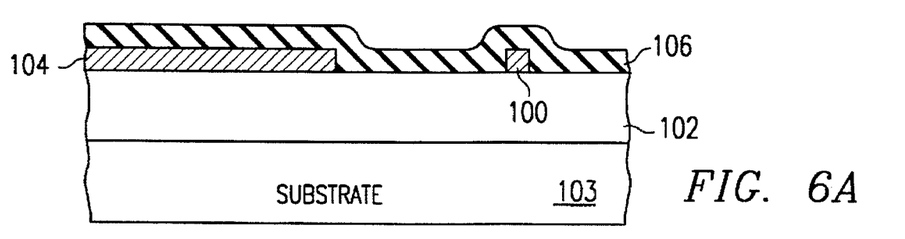
FIGS. 6(a)–6(h) present yet another exemplary laser repair process sequence in accordance with the invention.
Figure 6B:
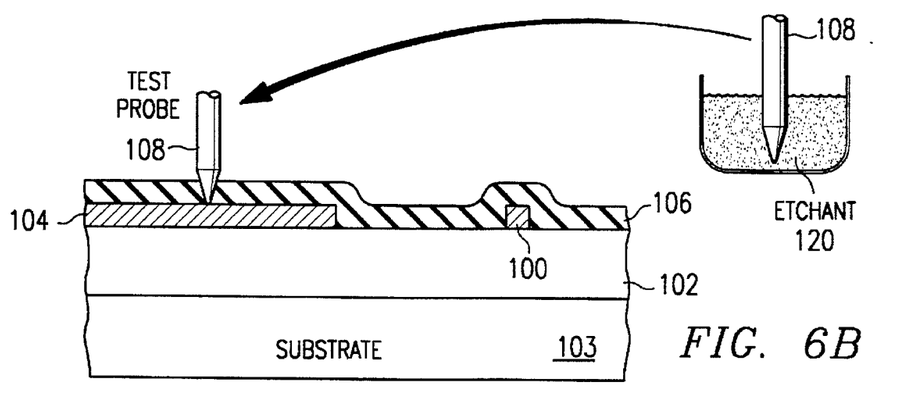
Figure 6C:
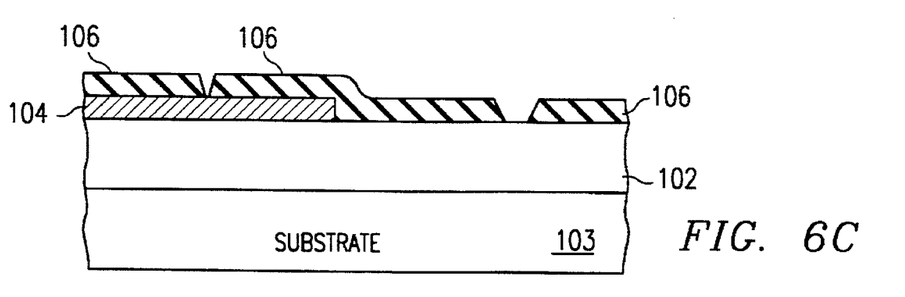
Figure 6D:
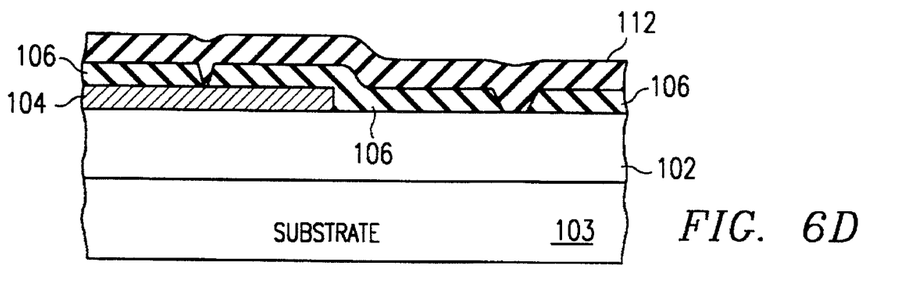
Figure 6E:
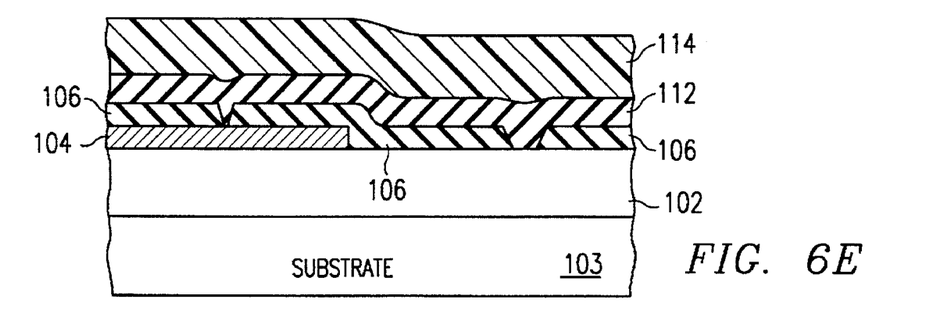
Figure 6F:
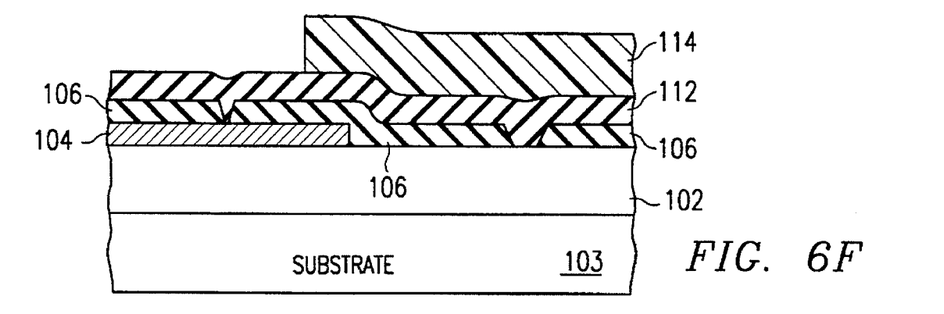
Figure 6G:
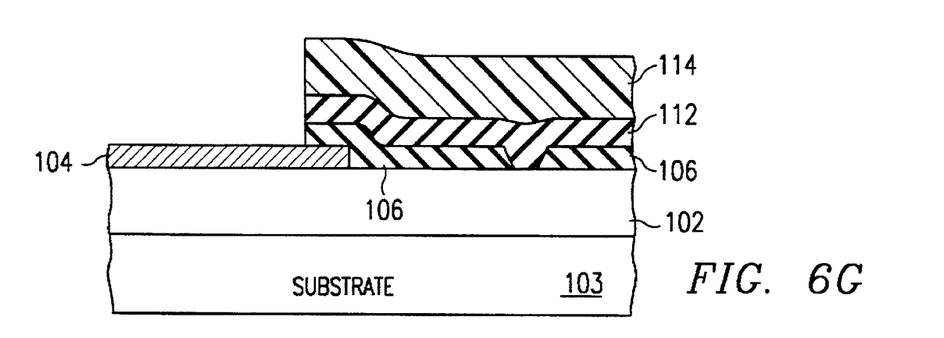
Figure 6H:
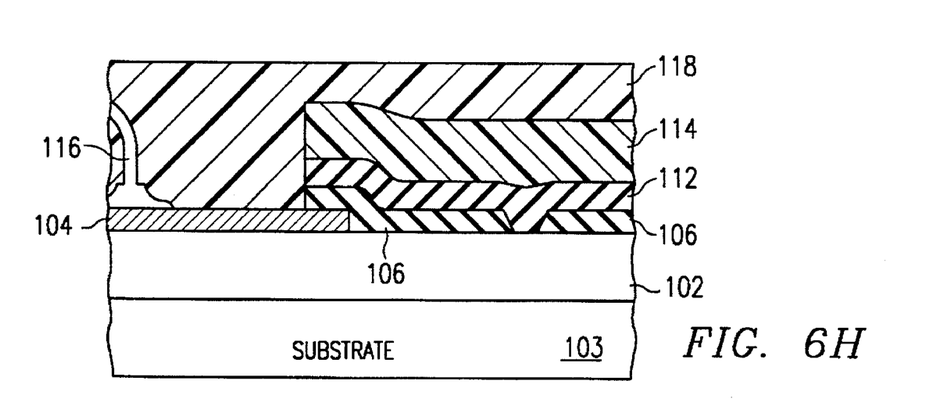
Figure 7:
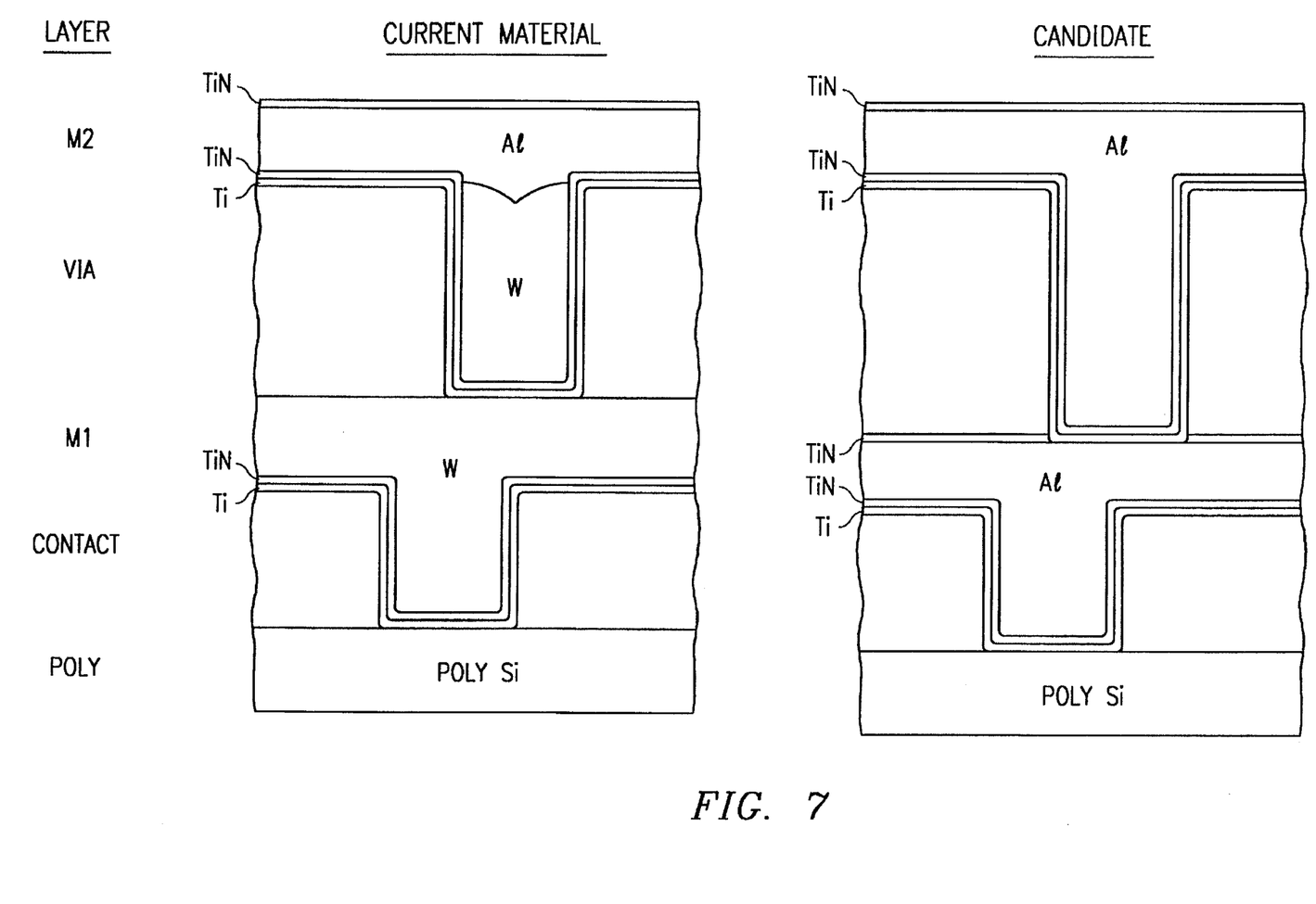
FIG. 7 shows a cross section of an integrated circuit device with vias and contacts for making connection between conducting layers.

The sequence of steps is identical except for the step shown in FIG. 6(b). Instead of mechanically breaking through the cap oxide with a test probe 108, a chemical etch is used to aid penetration through the cap oxide. Thus the probe is first partially immersed in an etchant 120 and then is pressed through the cap oxide 106 to contact the conductive pad 104. Alternatively, an etchant may be cause to flow through or along the probe needle, or may be otherwise deposited by the mechanism that holds the probe tip.

Thus a new less costly sequence of processing steps has been presented for electrically testing an integrated circuit device and for replacing defective circuits with good redundant circuits. Some variations of the sequence also have been presented. The disclosed processing sequences and others made obvious in view thereof are considered to be covered by the appended claims.

What is claimed is:

1. A method for fabricating a semiconductor device, the method including the steps of:
   a. forming fuses in a first metallic layer, the fuses being surrounded by an insulator on a semiconductor substrate, the fuses being covered by the insulator to an insulator thickness;
   b. forming bonding pads in a second metallic layer formed on the insulator;
   c. depositing a layer of cap oxide over the pads and the insulator;
   d. sintering the device; then
   e. etching back the entire layer of cap oxide except for sidewall oxides remaining on the bonding pads;
   f. performing an electrical test by way of the bonding pads;
   g. trimming at least a part of the fuses through said insulator thickness of said insulator with a laser beam; and
   h. depositing a layer of silicon nitride over the bonding pads and the insulator.

2. The method for fabricating a semiconductor device, in accordance with claim 1 and including the further steps of:
   depositing a pix coating over the layer of silicon nitride;
   patterning the pix coating for exposing the pads;
   etching the pix coating and the layer of silicon nitride to expose the bonding pads; and
   attaching bonding wires to the exposed bonding pads.

3. A method for fabricating a semiconductor device, the method including the steps of:
   a. forming fuses in a first metallic layer, the fuses being surrounded by an insulator on a semiconductor substrate, the fuses being covered to insulator thickness by said insulator;
   b. forming bonding pads in a second metallic layer formed on the insulator;
   c. sintering the device without a cap oxide; then
   d. performing an electrical test by way of the bonding pads;
   e. trimming at least a part of the fuses through said insulator thickness of said insulator with a laser beam; and
   f. depositing a layer of dielectric over the bonding pads and the insulator.

4. The method for fabricating a semiconductor device, in accordance with claim 3 and including the further steps of:
   depositing a pix coating over the layer of dielectric;
   patterning the pix coating for exposing the bonding pads;
   etching the pix coating and the layer of silicon nitride to expose the bonding pads; and
   attaching bonding wires to the exposed bonding pads.

5. The method of claim 3 wherein the step of depositing a layer of dielectric includes the depositing of a layer of silicon nitride.

6. A method for fabricating a semiconductor device, the method including the steps of:
   a. forming fuses in a metal layer other than a last metallic layer, the fuses being surrounded by an insulator over a semiconductor substrate, the fuses being covered by said insulator to an insulator the thickness;
   b. forming metallic bond pads in the last metallic layer formed on the insulator;
   c. depositing a layer of cap oxide over pads and the insulator;
   d. sintering the device; then
   e. etching back the entire layer of cap oxide except for sidewall oxides remaining on the bonding pads;
   f. performing an electrical test by way of the bonding pads;
   g. trimming at least a part of the fuses with a laser beam through said insulator thickness of said insulator; and
   h. depositing a passivation layer over the bonding pads and the insulator.

7. A method for fabricating a semiconductor device, the method including the steps of:
   a. forming fuses in an first metallic layer, the fuses being surrounded by an insulator on a semiconductor substrate, the fuses being covered by an insulator thickness of said insulator;
   b. forming bond pads in a later metallic layer formed on the insulator;
   c. depositing a layer of cap oxide over the pads and the insulator;
   d. sintering the device; then
   e. etching back the entire layer of cap oxide except for the sidewall oxides remaining on the bonding pads;
   f. performing an electrical test by way of the bonding pads;
   g. trimming at least a part of the fuses through said insulator thickness of said insulator with a laser beam; and
   h. depositing a passivation layer over the bonding pads and the insulator.

* * * * *